United States Patent [19]

Balzano

[11] Patent Number: 5,691,509
[45] Date of Patent: Nov. 25, 1997

[54] FLEXIBLE CABLE TERMINATION AND CONNECTOR SYSTEM

[76] Inventor: Alfiero Balzano, 11762 "O" Western Ave., Stanton, Calif. 90680

[21] Appl. No.: 526,689

[22] Filed: Sep. 11, 1995

[51] Int. Cl.$^6$ .................................................. H01R 9/07
[52] U.S. Cl. ................ 174/117 F; 174/117 FF; 29/847
[58] Field of Search ................ 174/117 F, 117 FF; 29/847, 884, DIG. 16; 439/493

[56] References Cited

U.S. PATENT DOCUMENTS

| | | | |
|---|---|---|---|
| 3,523,844 | 8/1970 | Crimmins et al. | 156/52 X |
| 4,357,750 | 11/1982 | Ostman | 29/847 |
| 5,090,121 | 2/1992 | Gaddis | 29/847 |
| 5,496,970 | 3/1996 | Spencer | 174/117 F |
| 5,517,756 | 5/1996 | Shirai et al. | 29/847 |

*Primary Examiner*—Hyung S. Sough
*Assistant Examiner*—Chau N. Nguyen
*Attorney, Agent, or Firm*—Roger A. Marrs

[57] ABSTRACT

The invention covers a flexible cable termination and a connector for securing the flexible cable termination to surface contact pads on a rigid substrate. The termination of the flexible cable includes flattened, axially extending conductor pads. Each of the conductor pads includes at least two nodes or pressure point contacts extending normal to the pad axis. The connection system includes threaded registration pins on the substrate and registration holes adjacent the conductor pads of the cable through which the pins extend so as to permit the conductor pads of the cable to be aligned with the contact pads on the substrate when the former is disposed atop the latter. The pins also hold a rubber compression pad and a pressure applying spring member atop the cable conductor pads, and bolts thread down over the pins to hold the components in place.

1 Claim, 1 Drawing Sheet

FLEXIBLE CABLE TERMINATION AND CONNECTOR SYSTEM

BACKGROUND OF THE INVENTION

1. Field of the Invention

The present invention relates to devices for effecting secure connections of cable conductors to contacts on rigid substrates, and more particularly to a novel termination for a flexible flat cable and a connector device for enabling solderless attachment of the conductors of a flexible flat cable to the surface of a rigid substrate, such as a printed circuit board, an LCD display or a flat circuit interface.

2. Description of the Related Art

Connectors for effecting solderless attachment of one set of conductors on a circuit carrier to a surface of another circuit carrier are known in the prior art. Such connectors often are provided with fasteners, such as bolts, which are secured in openings in one or both of the boards themselves, and in the fastening fixtures used to hold the carriers together.

One of the more serious problems encountered in the use of such connections has been the lack of reliability in maintaining electrical continuity, especially during periods of temperature fluctuations, or as a result of shock or vibration. In situations where external forces or vibrations are applied, the carriers shift and therefore alter the forces applied by the connectors. In situations where temperature changes are encountered, the carriers themselves distort or warp so that the conductors lose contact with one another and the desired connections are broken or otherwise defeated.

OBJECTS AND SUMMARY OF THE INVENTION

It is therefore an object of the invention to provide apparatus for maintaining electrical continuity between conductor pads of a flat cable and contact pads on a flat substrate, which will overcome all the deficiencies and drawbacks of connector systems currently known.

Another object of the invention is to provide a novel conductor pad where electrical connection between the pad and a surface mount contact can be assured regardless of temperature fluctuations, impacts, or vibrations.

Another object of the present invention is to provide a spring biased connection system for maintaining conductor pads of a flat cable in engagement with surface contact pads on a rigid substrate, where the flat cable conductor pads include a pair of axially aligned pressure point contact nodes for establishing a redundant electrical connection.

These and other objects are attained by the connection system of the present invention in which conductor pads of a flat flexible cable are secured to surface contact pads on a rigid substrate. Each of the conductor pads of the flat cable include a duality of pressure point contacts. The connection system includes threaded registration pins on the substrate and registration holes adjacent the conductor pads of the cable through which the pins extend so as to permit the conductor pads of the cable to be aligned with the contact pads on the substrate when the former is disposed atop the latter. The pins also hold a rubber compression pad and a pressure applying spring member atop the cable conductor pads, and bolts thread down over the pins to hold the components in place.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 1:
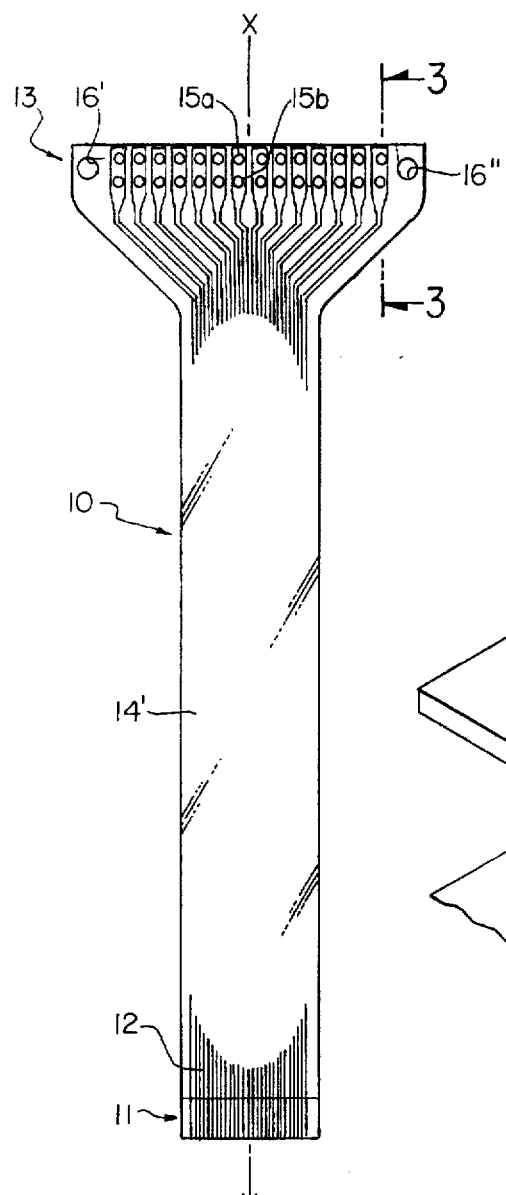
FIG. 1 depicts a length of the flat cable according to the present invention.

Referring now to FIG. 1, there is shown a length of flat flexible cable 10 which includes conductors 12 disposed side by side and parallel to one another along longitudinal axis X—X.

The conductors 12 run from a first end 11 of the cable to a second end 13 of the cable. Insulating material covers the conductors on both sides, and at the first end region, a portion of the upper layer 14' of the insulation atop the conductors is removed to form a first cable termination. At the cable second end, the conductors are fanned out and arranged in parallel and side by side to form a second cable termination. Each conductor at the second termination includes axially disposed pressure point contact nodes 15 (for purposes of this discussion, FIGS. 1 and 3 show a pair of nodes 15a, 15b associated with each conductor; however, the present invention also contemplates three or more axially arranged contact nodes formed on each of the conductors, depending on the axial length of the second cable termination).

Figure 3:
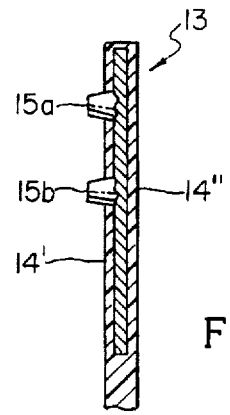
FIG. 3 is a cross-sectional view of the flat cable conductor pads taken along the section line 3—3 in FIG. 1.

The nodes 15a and 15b are formed to one side of the flat cable conductor (in FIG. 3, the nodes are shown to be disposed on the same side 14' of the cable as the first termination; however, it is to be understood that the nodes could be formed on the side 14" of the cable opposite that on which the first termination has been formed).

The nodes are formed by a step etching process, where, after application of a masking material to the portions of the conductors which are not to be affected, the thickness of the conductors are reduced in stages by repeated immersion in an etching solution. When an appropriate thickness of the conductor has been removed, the remaining conductor portions are encased in insulative material, while the two contact pressure point nodes are left exposed (i.e., uncovered).

Figure 2:
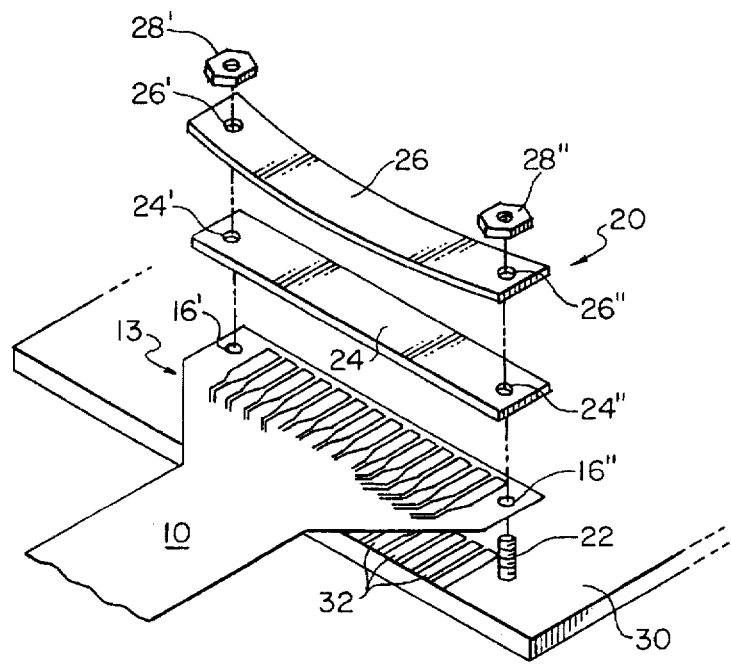
FIG. 2 is a perspective exploded view of the flat cable conductor pads positioned atop the contact pad region of a rigid substrate, and connector components for securing the flat cable to the rigid substrate.

FIG. 2 shows the connection system 20 which enables the maintenance of electrical continuity between the conductor pads at the second end of the flexible flat cable and the contact pads on the rigid substrate.

The connection system 20 includes registration pins 22 carried by the substrate 30 (although only one pin has been shown in FIG. 2, the present invention contemplates two such pins, one on each side of the set of contact pads 32), the second cable termination 13, a compression stabilizer element 24 which includes apertures 24' and 24" at opposite ends, a pressure stabilizer element 26 which includes apertures 26' and 26" at opposite ends, and bolts 28' and 28", each adapted for threaded engagement with a respective one of the registration pins.

The registration pins 22, provided on opposite sides of the region over which the contact pads 32 extend, may be affixed in and carried by the substrate, or they may be removably inserted through apertures formed in the substrate. Each of the pins are threaded and are adapted to be inserted into nuts or bolts 24a, 24b, the purpose of which will be described in further detail below.

In effecting the connection, the second termination of the flat cable is disposed relative to the substrate 30 such that the nodes 15a and 15b are arranged face to face in overlying relationship with the contact pads 32 on the substrate 30. Apertures 16' and 16" in the cable second termination are placed over the registration pins 22 and the cable is pushed, while engaged with the pins, down toward the contact pads 32 on the substrate such that the nodes 15a and 15b make engagement with the contact pads 32. Next, a compression stabilizer 24, preferably comprised of a rubber material, is arranged atop the cable second termination, with the apertures 24' and 24" in engagement with respectively appropriate registration pins. Next, a spring-like pressure stabilizer 26 is placed atop the compression stabilizer 24, with the apertures 26' and 26" engaging respective registration pins 22. Finally, two bolts 28' and 28" are screwed down about the pins 22 to such an extent that the entire stack of components is tightly secured.

There has thus been described a novel flat cable termination and a connection system for using the cable termination with an array of contact pads on a rigid substrate. The nodes 15a and 15b may be axially aligned on each conductor end, as shown in the FIG. 1 representation, or they may be axially offset on the conductor end. Each of the nodes may have a surface configured for engagement with the contact pads 32 which is flat, smooth or polished; alternatively, the surface may be toughened, or even pointed for digging engagement with the contact pads 32 of the substrate.

While the present invention has been described in conjunction with specific embodiments thereof, it is evident that many alternatives, modifications, and variations will be apparent to those skilled in the art in light of the foregoing description. Accordingly, the present invention is intended to embrace all alternatives, modifications, and variations which fall within the spirit and scope of the appended claims.

What I claim is:

1. A flat flexible cable, comprising:

a length of cable including conductors disposed side-by-side and parallel to one another, said conductors being encased in insulation material, said length of cable having a first connector end and a second connector end;

said conductors at said first end being exposed for a predetermined length;

said conductors at said second end including at least two two contact nodes projecting away from said conductors, all portions of said conductors at said second end, except said contact nodes, being encased in said insulation material;

the width of said cable at said second end exceeds the width of said cable at said first end, and said cable second end further comprises registration holes through the insulation which are disposed on opposite sides of said conductors;

said conductors at said second end are substantially flattened and extend along the longitudinal axis of said cable, and said nodes extend in a direction which is normal to said axis;

contact pads;

said nodes include roughened outer surfaces for scraping engagement with said contact pads; and means disposed against said second end forcibly urging said nodes into engagement with said contact pads.

\* \* \* \* \*